(12) United States Patent
Arakawa et al.

(10) Patent No.: US 6,703,285 B2
(45) Date of Patent: Mar. 9, 2004

(54) METHOD FOR MANUFACTURING CAPACITOR STRUCTURE, AND METHOD FOR MANUFACTURING CAPACITOR ELEMENT

(75) Inventors: Yoshikazu Arakawa, Tokyo (JP); Keiichi Hashimoto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/254,788

(22) Filed: Sep. 26, 2002

(65) Prior Publication Data

US 2003/0219955 A1 Nov. 27, 2003

(30) Foreign Application Priority Data

May 27, 2002 (JP) .......................... 2002-152027

(51) Int. Cl.[7] .......................... H01L 21/20; H01L 21/26; H01L 21/30
(52) U.S. Cl. ...................... 438/396; 438/398; 438/410; 438/412; 438/459
(58) Field of Search ................ 438/396, 459, 438/425, 445, 311, 359, 368, 410, 411, 412, 424, 426, 479, 301, 516, 910, 398

(56) References Cited

U.S. PATENT DOCUMENTS

| 5,049,514 A | | 9/1991 | Mori | |
|---|---|---|---|---|
| 5,805,408 A | * | 9/1998 | Maraschin et al. | 361/234 |
| 5,847,918 A | * | 12/1998 | Shufflebotham et al. | 361/234 |
| 6,096,404 A | * | 8/2000 | Ghantiwala | 428/138 |
| 6,291,315 B1 | * | 9/2001 | Nakayama et al. | 438/459 |
| 6,492,911 B1 | * | 12/2002 | Netzer | 340/870.37 |

FOREIGN PATENT DOCUMENTS

| JP | 7-24261 | 3/1995 |
|---|---|---|
| JP | 63237567 | 10/1998 |
| JP | 2001250795 | 9/2001 |

* cited by examiner

Primary Examiner—Michael S. Lebentritt
(74) Attorney, Agent, or Firm—Volentine Francos, PLLC (57) ABSTRACT

An object of the present invention is to provide a method for manufacturing a capacitor structure that makes it possible to control the accumulation of electric charges on a top electrode film as a factor that brings about electrostatic breakdown in the insulating film of an MIM capacitor structure, and to provide a method for manufacturing capacitor elements with a low percent defective.

The first technique is characterized in that a top electrode film is formed on a substrate after a grounded conductive member is brought into contact with a bottom electrode film or insulating film, and the conductive member is then separated from the bottom electrode film or insulating film.

The second technique is characterized in that a top electrode film is formed on a substrate in a state in which a member kept at a negative potential is disposed around the substrate.

28 Claims, 8 Drawing Sheets

METHOD FOR MANUFACTURING CAPACITOR STRUCTURE, AND METHOD FOR MANUFACTURING CAPACITOR ELEMENT

BACKGROUND OF THE INVENTION

1. Field of the Invention

The present invention relates to a method for manufacturing an MIM (metal film—insulating film—metal film) capacitor structure and to a method for manufacturing an MIM capacitor element, and more particularly to a method for forming an MIM capacitor structure on a semiconductor wafer provided with an integrated circuit.

2. Description of the Related Art

The following techniques are used to form MIM capacitor structures on semiconductor wafers provided with integrated circuits.

Specifically, there are methods in which a bottom electrode film (for example, an AlCu film) is formed by sputtering on a semiconductor wafer, an insulating film (for example, an SiON film) is formed by CVD thereon, and a top electrode film (for example, a TiN film) is formed by sputtering on the insulating film.

Sputtering is a method in which inert gas ions (for example, those of Ar gas) produced by a plasma discharge are accelerated by an electric field and directed to a target (starting material to be vapor-deposited), the atoms in the target surface are flicked out, and the flicked-out atoms are deposited on a semiconductor wafer, yielding a thin film.

In sputtering, however, the species flicked out during the formation of the top electrode film are not limited solely to the atoms that constitute the target, but also include the high-energy electrons present in the plasma region in the vicinity of the target. When these electrons collide with the top electrode film during the formation process, electric charges accumulate on the top electrode film, which is one of the electrodes of an MIM capacitor structure. An electric discharge occurs when the electric charges accumulate beyond the withstand voltage limit of the insulating film on the top electrode film during the formation process. At this point, the insulating film is broken down electrostatically (this type of breakdown will be referred to hereinbelow as an "electrostatic breakdown").

A resulting drawback is that an electrostatically broken-down MIM capacitor structure or a capacitor structure fabricated using this MIM capacitor structure becomes incapable of operating in regular manner.

SUMMARY OF THE INVENTION

The present invention was created in order to overcome the above-described drawback of the prior art. An object of the present invention is to provide a method for manufacturing a capacitor structure and a method for manufacturing a capacitor element that allow percent defective to be reduced by controlling the accumulation of electric charges on the top electrode film as a factor that brings about electrostatic breakdown of an insulating film.

A method for manufacturing a capacitor structure in accordance with the present invention comprises the steps of forming a bottom electrode film 21 on a substrate 10, forming an insulating film 22 in the area of the bottom electrode film 21 that excludes a specific area 21a, bringing a grounded conductive member 31 into contact with the specific area 21a of the bottom electrode film 21, forming a top electrode film 23 on the insulating film 22 by performing sputtering such that part thereof is in contact with the specific area 21a of the bottom electrode film 21, and separating the conductive member 31 from the specific area 21a of the bottom electrode film 21.

Another method for manufacturing a capacitor structure in accordance with the present invention comprises the steps of forming a bottom electrode film 51 on a substrate 10, disposing a first clamp ring 61 whose inside diameter is less than the outside diameter of the bottom electrode film 51 above the bottom electrode film 51 in the vicinity of the external periphery thereof, forming an insulating film 52 in an area not covered by the first clamp ring 61 on the bottom electrode film 51, separating the first clamp ring 61 from the upper portion of the bottom electrode film 51, bringing a grounded second clamp ring 62 whose inside diameter is less than the outside diameter of the bottom electrode film 51 but greater than the inside diameter of the first clamp ring 61 into contact with the bottom electrode film 51 in the vicinity of the external periphery thereof, forming a top electrode film 53 on the insulating film 52 by performing sputtering such that part thereof is in contact with the bottom electrode film 51, and separating the second clamp ring 62 from the upper portion of the bottom electrode film 51.

Yet another method for manufacturing a capacitor structure comprises the steps of forming a bottom electrode film 71 on a substrate 10, forming an insulating film 72 on the bottom electrode film 71, bringing a grounded clamp ring 81 whose inner wall is formed substantially perpendicularly to the surface or the substrate 10 or whose inner wall is formed at an incline toward the center of the substrate 10 into contact with the area in the vicinity of the external periphery of an insulating film 72, forming a top electrode film 73 by sputtering on the insulating film 72 and in the upper portion of the clamp ring 81 with the inner wall, and separating the clamp ring 81 from the insulating film 72.

Still another method for manufacturing a capacitor structure in accordance with the present invention comprises the steps of forming a bottom electrode film 91 on the substrate 10, forming an insulating film 92 on the bottom electrode film 91, and forming a top electrode film 93 on the insulating film 92 by performing sputtering in a state in which a member kept at a negative potential is disposed around the substrate 10.

An additional method for manufacturing a capacitor element in accordance with the present invention comprises the steps of forming a capacitor structure on a substrate by any of the manufacturing methods described above, and partially removing the bottom electrode film 21, insulating film 22, and top electrode film 23 constituting the capacitor structure to form a single capacitor element or a plurality of capacitor elements from the remaining bottom electrode film 21, insulating film 22, and top electrode film 23.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

The method for manufacturing a capacitor structure in accordance with the present invention comprises the following two techniques.

A characteristic feature of the first technique is that when a top electrode film is formed on a substrate provided with a bottom electrode film or insulating film, the top electrode film is formed after a grounded conductive member is brought into contact with the bottom electrode film or insulating film, and the conductive member is then separated from the bottom electrode film or insulating film.

A characteristic feature of the second technique is that when a top electrode film is formed on a substrate provided with a bottom electrode film or insulating film, the top electrode film is formed in a state in which a member kept at a negative potential is disposed around the substrate.

A characteristic feature of the additional method for manufacturing a capacitor element in accordance with the present invention is that a capacitor structure is formed on a substrate by the first or second technique; the bottom electrode film, insulating film, and top electrode film constituting the capacitor structure are partially removed; and a single capacitor element or a plurality of capacitor elements are formed from the remaining bottom electrode film, insulating film, and top electrode film.

First Embodiment

Figure 1:
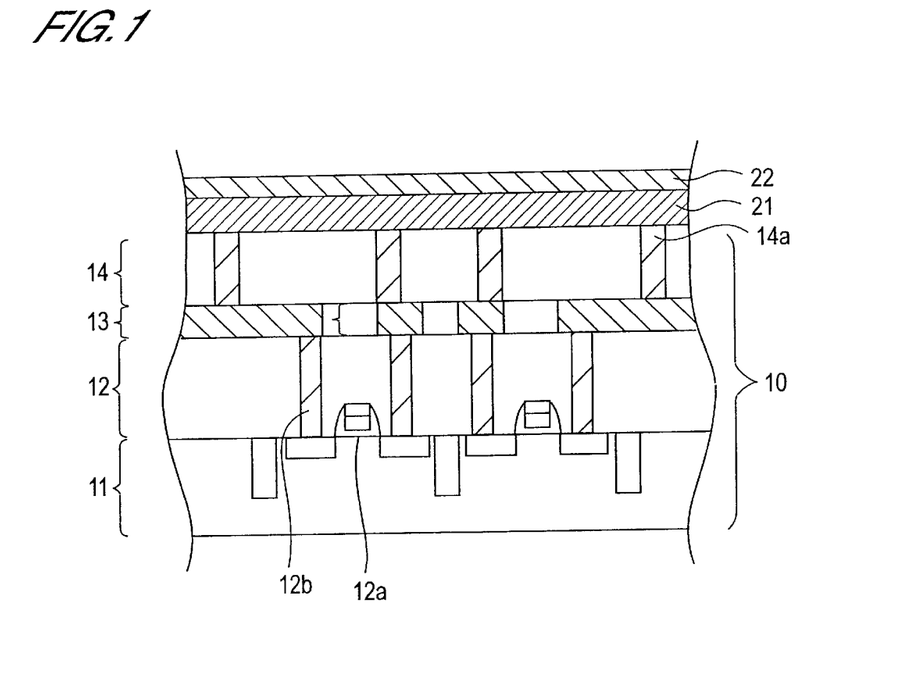
FIG. 1 is a fragmentary cross-sectional view schematically depicting a manufacturing process (part 1) related to the method for manufacturing a capacitor structure in accordance with a first embodiment of the present invention.

FIG. 1 is a fragmentary cross-sectional view schematically depicting a manufacturing process (part 1) related to the method for manufacturing a capacitor structure in accordance with a first embodiment of the present invention. FIG. 1 depicts a state in which a bottom electrode film 21 and an insulating film 22 have been formed on a substrate 10.

Figure 2:
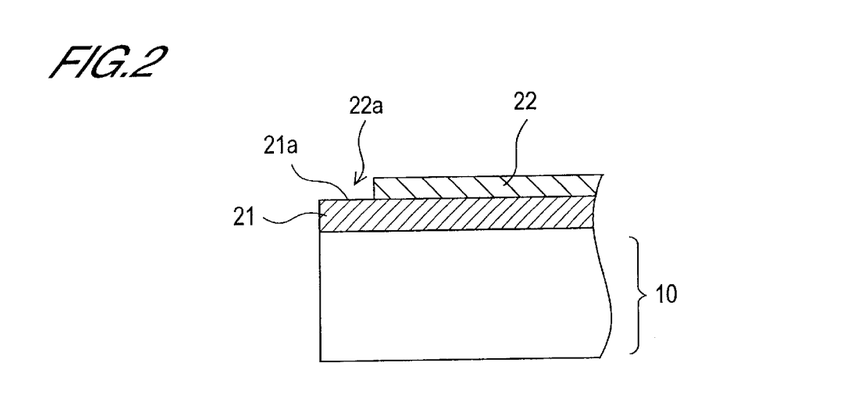
FIG. 2 is a fragmentary cross-sectional view schematically depicting a manufacturing process (part 2) related to the method for manufacturing a capacitor structure in accordance with the first embodiment of the present invention.

FIG. 2 is a fragmentary cross-sectional view schematically depicting a manufacturing process (part 2) related to the method for manufacturing a capacitor structure in accordance with the first embodiment of the present invention. FIG. 2 depicts the state obtained by removing a portion 22a in the vicinity of the external periphery of the insulating film 22 formed in the process shown in FIG. 1.

Figure 3:
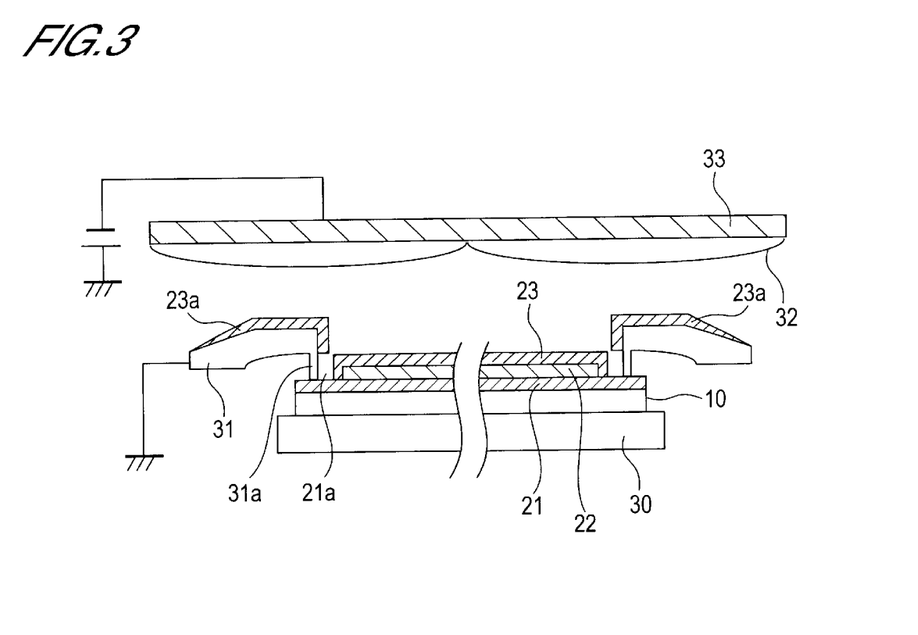
FIG. 3 is a cross-sectional view schematically depicting a manufacturing process (part 3) related to the method for manufacturing a capacitor structure in accordance with the first embodiment of the present invention.

FIG. 3 is a cross-sectional view schematically depicting a manufacturing process (part 3) related to the method for manufacturing a capacitor structure in accordance with the first embodiment of the present invention. FIG. 3 depicts a process (a cross-sectional view without the area near the center of the substrate 10) for forming a top electrode film 23 on the substrate 10, which is mounted on the stage 30 of a sputtering apparatus.

The substrate 10 used in the method for manufacturing a capacitor structure in accordance with the present invention comprises an Si substrate (semiconductor wafer) 11; an intermediate insulating layer 12 for covering a transistor 12a, a conductive film 12b, and the like; a wiring layer 13 containing AlCu wiring; and an insulating layer 14 for covering a W plug 14a, as shown in FIG. 1. The substrate 10 is not limited to the arrangement shown in FIG. 1, however.

According to the method for manufacturing a capacitor structure pertaining to the first embodiment, an AlCu film 21 is first formed as a bottom electrode film by sputtering on the substrate 10, as shown in FIG. 1. The material of the bottom electrode film is not limited to AlCu, however. Nor is the method for forming the bottom electrode film limited to sputtering. Furthermore, the structure of the bottom electrode film is not limited to a single-layer structure, and a metal film with a stacked structure having two or more layers is also acceptable.

An SiON film 22 is subsequently formed as a capacitor-insulating film by plasma CVD on the AlCu film 21, as shown in FIG. 1. However, the material of the capacitor-insulating film is not limited to SiON, and an insulating film composed of $SiO_2$, SiN, or the like may also be formed. Nor is the method for forming the capacitor-insulating film limited to plasma CVD. Furthermore, the structure of the capacitor-insulating film is not limited to a single-layer structure, and an insulating film with a stacked structure having two or more layers is also acceptable.

The SiON film 22 (insulating film) is subsequently formed on the AlCu film 21 (bottom electrode film), as shown in FIGS. 18–21. FIGS. 18–21 are cross-sectional views schematically depicting the process (parts 1–4) for forming the insulating film.

Figure 18:
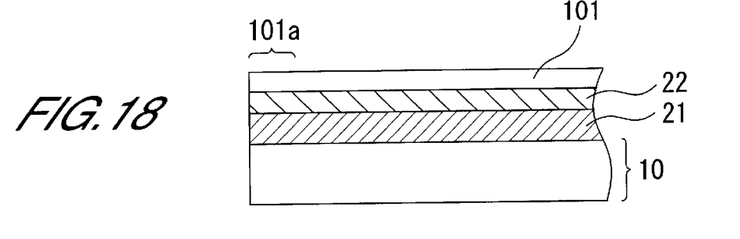
FIG. 18 is a cross-sectional view schematically depicting the process (part 1) for forming an insulating film.

A photoresist 101 is first applied to the SiON film 22, as shown in FIG. 18.

Figure 19:
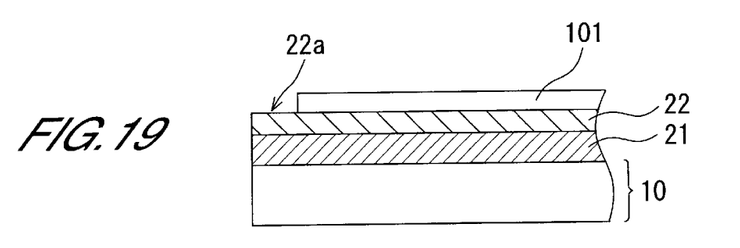
FIG. 19 is a cross-sectional view schematically depicting the process (part 2) for forming an insulating film.

Peripheral exposure or edge rinse is subsequently performed. Peripheral exposure is a treatment in which the edge 101a of the photoresist 101 is removed by a process in which solely the edge 101a of the photoresist 101 is exposed to light and developed, as shown in FIG. 19. Edge rinse is a treatment in which the edge 101a of the photoresist 101 is removed by applying a rinse solution to the edge 101a of the photoresist 101. The area (edge 101a) in the vicinity of the external periphery of the photoresist 101 is thus removed, and the portion 22a in the vicinity of the external periphery of the SiON film 22 is exposed.

Figure 20:
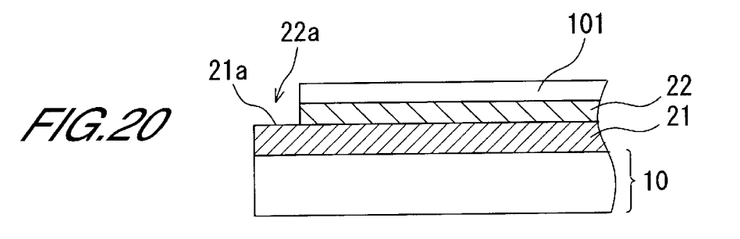
FIG. 20 is a cross-sectional view schematically depicting the process (part 3) for forming an insulating film.

As shown in FIG. 20, the portion 22a in the vicinity of the external periphery of the SiON film 22 is subsequently etched away by dry etching, for example.

Figure 21:
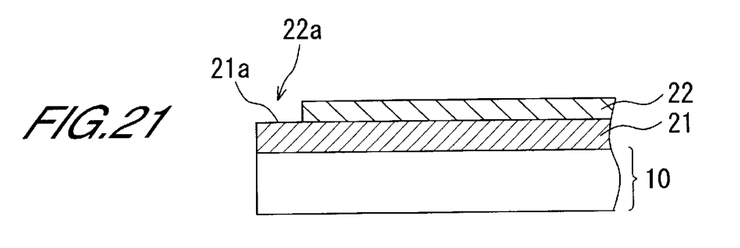
FIG. 21 is a cross-sectional view schematically depicting the process (part 4) for forming an insulating film.

The remaining photoresist 101 is then removed completely, as shown in FIG. 21.

As a result, the area 21a (annular peripheral area when viewed from above) in the vicinity of the external periphery of the AlCu film 21 is exposed, as shown in FIG. 2. However, the area in which the AlCu film 21 is exposed need not necessarily be annular and may be shaped as an arc or the like. In addition, the position of the area in which the AlCu film 21 is exposed may be any other position outside the area for forming the integrated circuit (area 18 in FIG. 5 below).

A sputtering apparatus (not shown) subsequently brings the bottom extension 31a of a grounded clamp ring 31 into contact with the peripheral area 21a of the AlCu film 21, as shown in FIG. 3. A component whose inside diameter is slightly greater than the outside diameter of the SiON film 22 is used herein as the clamp ring 31. The member in contact with the peripheral area 21a on the AlCu film 21 is commonly the clamp ring 31, but this member need not necessarily be the clamp ring 31, and a grounded conductive member other than the clamp ring 31 may also be used. The sputtering apparatus is commonly equipped with a conductive clamp ring. This arrangement is beneficial in terms of cost because it is sufficient to modify the sputtering apparatus in a manner such that the clamp ring 31 is grounded when such a clamp ring is used. The bottom extension 31a of the clamp ring 31 can have any shape that allows conductivity to be maintained in relation to the peripheral area 21a on the AlCu film 21.

The sputtering apparatus (not shown) subsequently forms a top electrode film 23 on the SibN film 22 and in the area that connects the top of the SiON film 22 and the top of the AlCu film 21, as shown in FIG. 3. Specifically, the sputtering apparatus causes inert gas ions (for example, those of Ar gas) produced by a plasma discharge (in a plasma area 32) to be accelerated by an electric field, directed to a target (starting material to be vapor-deposited) 33, and used to flick out atoms from the surface of the target 33. The flicked-out atoms deposit on the SiON film 22 and in the area that connects the SiON film 22 and the AlCu film 21 (that is, in the area not covered by the clamp ring 31), and form a TiN film 23 as a top electrode film. The flicked-out atoms also deposit in the upper portion of the clamp ring 31 and form a TiN film 23a.

The sputtering apparatus (not shown) subsequently separates the bottom extension 31a of the clamp ring 31 from the specific area 21a of the AlCu film 21 (bottom electrode film) by the lifting of the clamp ring 31 or the lowering of the substrate 10.

The process for manufacturing an MIM capacitor structure configured as a metal film—insulating film—metal film on a substrate is thereby completed.

Figure 4:
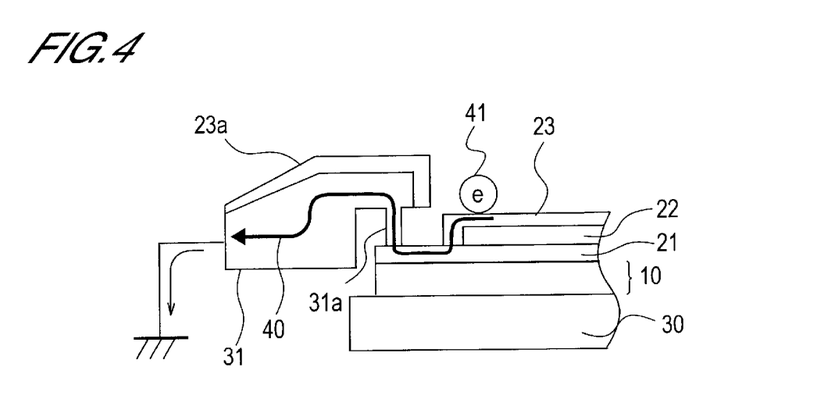
FIG. 4 is a fragmentary enlarged view of FIG. 3.
Figure 5:
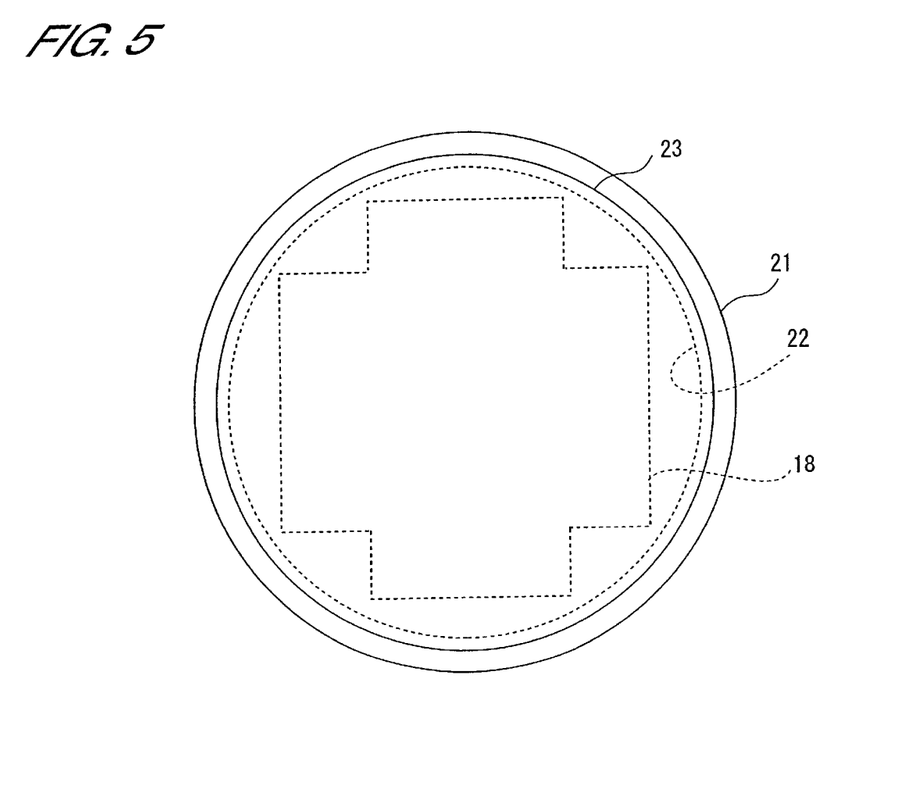
FIG. 5 is a top view schematically depicting the capacitor structure in FIG. 3.

FIG. 4 is a fragmentary enlarged view of FIG. 3, and FIG. 5 is a top view schematically depicting a substrate with an MIM capacitor structure. In FIG. 5, the inside of the area 18 shown by a broken line is the area for forming a circuit element, and the outside of the area 18 is the area devoid of circuit elements.

As described above, the method for manufacturing a capacitor structure in accordance with the first embodiment is performed such that when a TiN film 23 is formed by sputtering, the bottom extension 31a of a grounded clamp ring 31 is brought into contact with an AlCu film 21, and the TiN film 23 is formed not only on the SiON film 22 but also in the area that connects the top of the SiON film 22 and the specific area 21a of the AlCu film 21, as shown in FIG. 4. The TiN film 23 and AlCu film 21 therefore become electrically connected and acquire equal potential. An electron-conducting route (the electron flow is shown by arrow 40 in FIG. 4) is also formed by the TiN film 23, AlCu film 21, clamp ring 31, and ground when the TiN film 23 is formed.

For this reason, the electrons 41 arriving at the TiN film 23 during the formation of the TiN film 23 flow to the ground via the TiN film 23, AlCu film 21, and clamp ring 31 even when captured by the TiN film 23. The result is that no electric charge accumulates on the TiN film 23, and the SiON film 22 is prevented from being electrostatically broken down by electric charges accumulating on the TiN film 23.

The method for manufacturing a capacitor structure in accordance with the first embodiment can be performed merely by modifying the sputtering apparatus for forming the top electrode film (TiN film 23) such that the clamp ring 31 (conductive member) is grounded. For this reason, the method for manufacturing a capacitor structure in accordance with the first embodiment allows capacitor structures having a low percent defective to be produced at a low cost.

Another feature of the method for manufacturing a capacitor structure in accordance with the first embodiment is that, in the process of removing part of the SiON film 22, the area (edge 101a) in the vicinity of the external periphery of the photoresist 101 can be removed by peripheral exposure or edge rinse without the use of expensive steppers. Therefore, the method for manufacturing a capacitor structure in accordance with the first embodiment allows capacitor structures having a low percent defective to be produced at a low cost in this respect as well.

Figure 6:
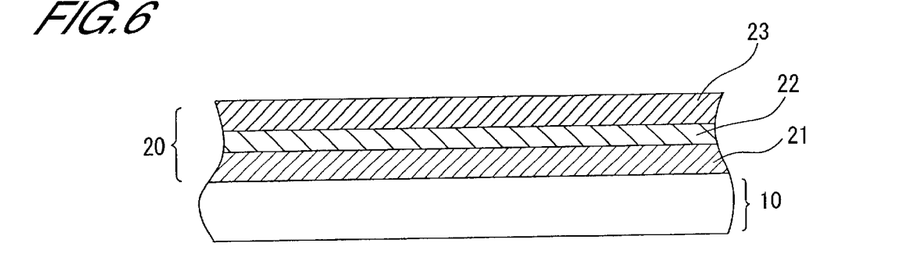
FIG. 6 is a fragmentary cross-sectional view schematically depicting the process for manufacturing (part 1) a capacitor element.
Figure 7:
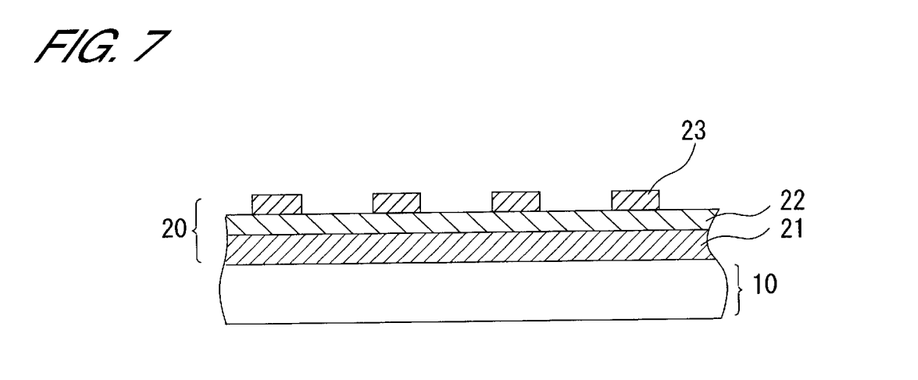
FIG. 7 is a fragmentary cross-sectional view schematically depicting the process for manufacturing (part 2) a capacitor element.
Figure 8:
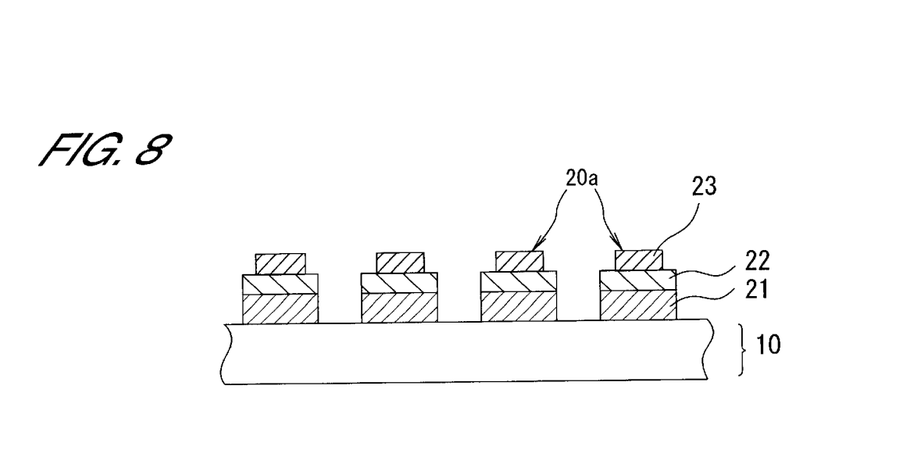
FIG. 8 is a fragmentary cross-sectional view schematically depicting the process for manufacturing (part 3) a capacitor element.

Following is a description of a process for manufacturing MIM capacitor elements from MIM capacitor-structures fabricated by the process shown in FIGS. 1–3. FIGS. 6–8 are fragmentary cross-sectional views schematically depicting the process (parts 1–3) for manufacturing a capacitor element.

According to the method for manufacturing an MIM capacitor element, a photoresist (not shown) is first formed and etched by photolithography in the MIM capacitor structure 20 shown in FIG. 6. The TiN film 23 is thereby partially removed and patterned, as shown in FIG. 7.

A photoresist (not shown) is subsequently formed and etched by photolithography in the MIM capacitor structure 20 shown in FIG. 7. The SiON film 22 and AlCu film 21 are thereby partially removed, and MIM capacitor structures 20a are completed, as shown in FIG. 8.

The MIM capacitor structures 20a have a low percent defective because they are fabricated from an MIM capacitor structure 20 manufactured by a method in which no electric charge accumulates on the TiN film 23.

Second Embodiment

Figure 9:
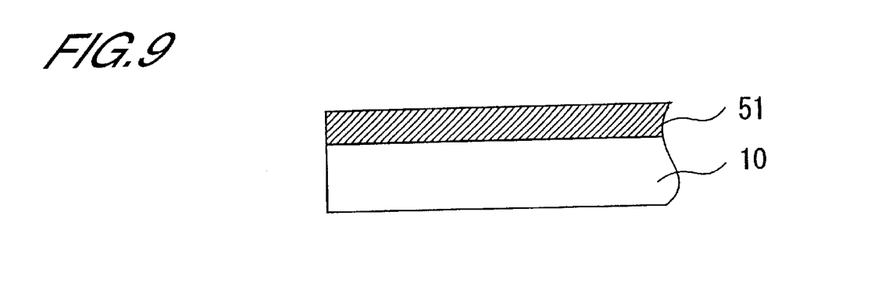
FIG. 9 is a fragmentary cross-sectional view schematically depicting a manufacturing process (part 1) related to the method for manufacturing a capacitor structure in accordance with a second embodiment of the present invention.
Figure 10:
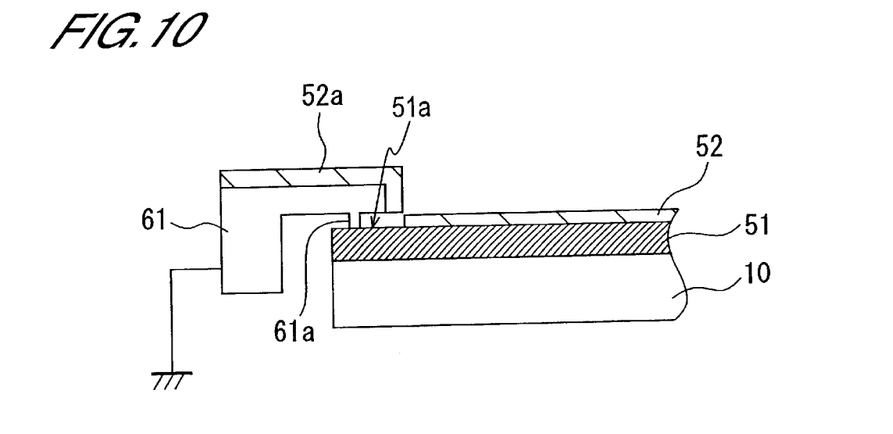
FIG. 10 is a fragmentary cross-sectional view schematically depicting a manufacturing process (part 2) related to the method for manufacturing a capacitor structure in accordance with the second embodiment of the present invention.
Figure 11:
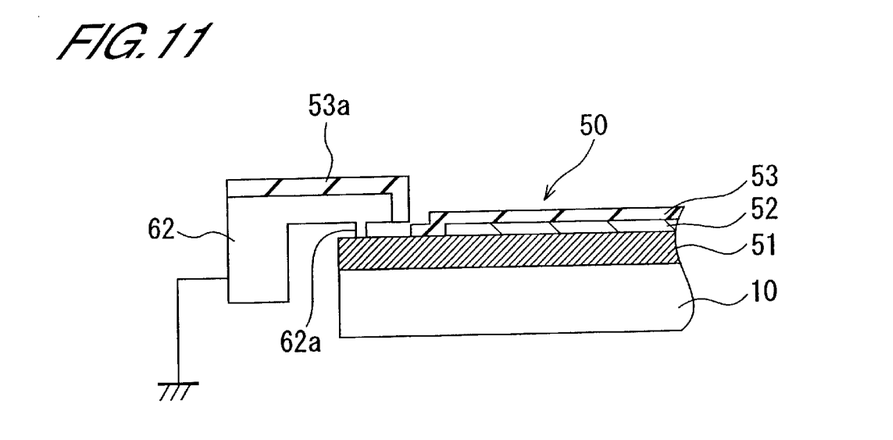
FIG. 11 is a fragmentary cross-sectional view schematically depicting a manufacturing process (part 3) related to the method for manufacturing a capacitor structure in accordance with the second embodiment of the present invention.

FIGS. 9–11 are fragmentary cross-sectional views schematically depicting a manufacturing process (parts 1–3) related to the method for manufacturing a capacitor structure in accordance with a second embodiment of the present invention. The substrate 10 shown in FIGS. 9–11 is the same as the one used in the first embodiment.

According to the method for manufacturing a capacitor structure pertaining to the second embodiment, an AlCu film 51 is first formed as a bottom electrode film on the substrate 10 by sputtering, as shown in FIG. 9. The AlCu film 51 may be deposited on the entire surface of the substrate 10, or it may be deposited in a manner that minimizes edge exclusion. The material of the bottom electrode film is not limited to AlCu, however. Nor is the method for forming the bottom electrode film limited to sputtering. Furthermore, the structure of the bottom electrode film is not limited to a single-layer structure, and a metal film with a stacked structure having two or more layers is also acceptable.

In a CVD apparatus (not shown) on which a first clamp ring 61 is mounted, the first clamp ring 61 is subsequently placed above an AlCu film 51 in the vicinity of the external periphery thereof, as shown in FIG. 10. A component whose inside diameter is less than the outside diameter of the AlCu film 51 is used herein as the first clamp ring 61. In addition, the bottom extension 61a of the first clamp ring 61 is brought into contact with the. AlCu film 51. However, the member deposited in this step is not an electrode film. Therefore, the first clamp ring 61 does not necessarily need to be grounded. Nor is there any need to always bring the bottom extension 61a of the first clamp ring 61 into contact with the AlCu film 51.

In the CVD apparatus (not shown), an SiON film 52 is subsequently deposited as a capacitor-insulating film by plasma CVD on the AlCu film 51, as shown in FIG. 10. At this time, the CVD apparatus deposits the SiON film 52a on the first clamp ring 61 as well. For this reason, the area on the AlCu film 51 in which the SiON film 52 is deposited is a central area not covered by the first clamp ring 61. In addition, the area 51a in the vicinity of the external periphery of the AlCu film 51 is an exposed area not covered by the SiON film 52, as shown in FIG. 10. The material of the capacitor-insulating film is not limited to SiON, and an insulating film composed of $SiO_2$, SiN, or the like may also be formed. Nor is the method for forming the capacitor-insulating film limited to plasma CVD. Furthermore, the structure of the capacitor-insulating film is not limited to a single-layer structure, and an insulating film with a stacked structure having two or more layers is also acceptable. In addition, the area 51a in the vicinity of the external periphery of the AlCu film 51 does not need to be exposed completely and may be exposed only partially.

In the CVD apparatus (not shown), the bottom extension 61a of the first clamp ring 61 is subsequently separated from the AlCu film 51 by the lifting of the first clamp ring 61 or the lowering of the substrate 10, and the substrate 10 is moved to a sputtering apparatus (not shown).

In the sputtering apparatus (not shown), the bottom extension 62a of a grounded second clamp ring 62 is brought into contact with the area in the vicinity of the external periphery of the AlCu film 51, as shown in FIG. 11. A component whose inside diameter is less than the outside diameter of the AlCu film 51, but greater than the inside diameter of the first clamp ring 61 (that is, the outside diameter of the SiON film 52), is used in this case as the second clamp ring 62.

The sputtering apparatus subsequently forms a TiN film 53 as a top electrode film on the SiON film 52 and in the area that connects the top of the SiON film 52 and the top of the AlCu film 51, as shown in FIG. 11. Specifically, the sputtering apparatus causes inert gas ions (for example, those of Ar gas) produced by a plasma discharge to be accelerated by an electric field, directed to a target (vapor deposition material), and used to flick out atoms from the target surface. The flicked-out atoms deposit on the SiON film 52 and in the area that connects the top of the SiON film 52 and the top of the AlCu film 51, and form a TiN film 53. The flicked-out atoms also deposit in the upper portion of the clamp ring 62, and form a TiN film 53a. The structure of the top electrode film is not limited to a single-layer structure, and an electrode film with a stacked structure having two or more layers is also acceptable.

The sputtering apparatus (not shown) subsequently separates the bottom extension 62a of the second clamp ring 62 from the AlCu film 51 (bottom electrode film) by the lifting of the second clamp ring 62 or the lowering of the substrate 10.

The process for manufacturing an MIM capacitor structure is thereby completed.

The process for forming an MIM capacitor element such as the one shown in FIG. 8 from an MIM capacitor structure 50 is the same as in the first embodiment.

As described above, the method for manufacturing a capacitor structure in accordance with the second embodiment is performed such that when a TiN film 53 is formed by sputtering, the bottom extension 62a of a grounded second clamp ring 62 is brought into contact with an AlCu film 51, and the TiN film 53 is formed not only on the SiON film 52 but also in the area that connects the top of the SiON film 52 and the specific area 51a of the AlCu film 51, as shown in FIG. 11. The TiN film 53 and AlCu film 51 therefore become electrically connected and acquire equal potential. An electron-conducting route is also formed by the TiN film 53, AlCu film 51, second clamp ring 62, and ground when the TiN film 53 is formed.

For this reason, the electrons arriving at the TiN film 53 during the formation of the TiN film 53 flow to the ground via the TiN film 53, AlCu film 51, and second clamp ring 62 even if captured by the TiN film 53. The result is that no electric charge accumulates on the TiN film 53, and the SiON film 52 is prevented from being electrostatically broken down by electric charges accumulating on the TiN film 53.

Another feature of the method for manufacturing a capacitor structure in accordance with the second embodiment is that the first clamp ring 61 is used without the need to employ expensive steppers in the processes for exposing the AlCu 51 (*1) in the peripheral area of the SiON film 52. Therefore, the method for manufacturing a capacitor structure in accordance with the second embodiment allows capacitor structures having a low percent defective to be produced at a low cost in this respect as well.

In all other respects the second embodiment is identical to the first embodiment.

Third Embodiment

Figure 12:
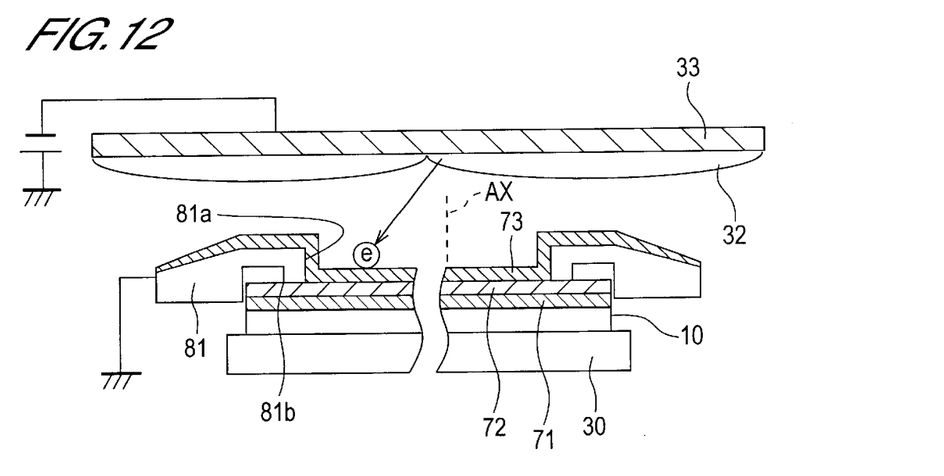
FIG. 12 is a cross-sectional view schematically depicting a manufacturing process related to the method for manufacturing a capacitor structure in accordance with a third embodiment of the present invention.

FIG. 12 is a cross-sectional view schematically depicting a manufacturing process related the method for manufacturing a capacitor structure in accordance with a third embodiment of the present invention. FIG. 12 depicts a process (a cross-sectional view without the area near the center of a substrate 10) for forming a top electrode film 73 on the substrate 10, which is mounted on the stage 30 of a sputtering apparatus.

In the manufacture of a capacitor structure in accordance with the third embodiment, a bottom electrode film 71 and an insulating film 72 are first sequentially formed on the substrate 10, as shown in FIG. 12. The process for forming the bottom electrode film 71 may, for example, be sputtering, which is the same as in the first embodiment. The process for forming the insulating film 72 may, for example, be plasma CVD, which is the same as in the first embodiment. The materials for the bottom electrode film 71 and insulating film 72 are the same as those used in the first embodiment.

The sputtering apparatus (hot shown) subsequently forms a top electrode film 73 in the manner described below.

The sputtering apparatus (not shown) provides a grounded clamp ring 81 when the top electrode film 73 is formed. The clamp ring 81 has a cylindrical inner wall 81a, as shown in FIG. 12. The cylindrical inner wall 81a is substantially parallel to the center axis AX of the clamp ring 81 (that is, substantially perpendicular to the surface of the insulating film 72). The sputtering apparatus brings the edge 81b in the lower portion of the inner wall 81a of the clamp ring 81 into contact with the area in the vicinity of the external periphery of the insulating film 72, as shown in FIG. 12.

In this state, the sputtering apparatus (not shown) deposits a TiN film 73 as a top electrode film on the insulating film 72, on the inner wall 81a of the clamp ring 81, and in the upper portion of the clamp ring 81 by sputtering.

The sputtering apparatus (not shown) subsequently separates the clamp ring 81 from the insulating film 72 by the lifting of the clamp ring 81 or the lowering of the substrate 10.

The process for manufacturing an MIM capacitor structure is thereby completed.

The process for forming an MIM capacitor element such as the one shown in FIG. 8 from an MIM capacitor structure is the same as in the first embodiment.

As described above, the method for manufacturing a capacitor structure in accordance with the third embodiment is performed such that when a TiN film 73 is formed by sputtering, the edge 81b of the inner wall 81a of a grounded second clamp ring 81 is brought into contact with an insulating film 72, whereby the TiN film 73 is formed not only on the insulating film 72 but also in the area that connects the top of the insulating film 72 and the clamp ring 81, as shown, in FIG. 12. An electron-conducting route is therefore formed by the TiN film 73, clamp ring 81, and ground when the TiN film 73 is formed.

For this reason, the electrons arriving at the TiN film 73 during the formation of the TiN film 73 flow to the ground via the TiN film 73 and clamp ring 81 even when captured by the TiN film 73. The result is that no electric charge accumulates on the TiN film 73, and the insulating film 72 is prevented from being electrostatically broken down by electric charges accumulating on the TiN film 73.

Figure 13:
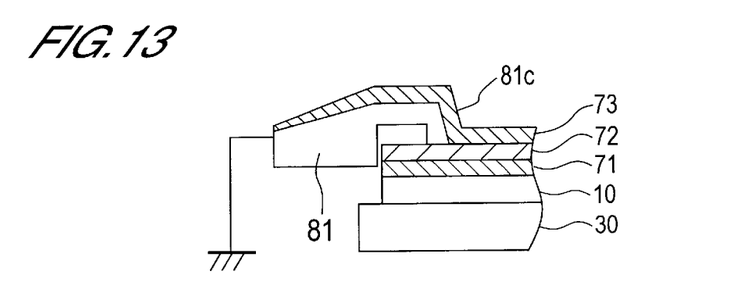
FIG. 13 is a fragmentary cross-sectional view schematically depicting a manufacturing process related to a modified example of the method for manufacturing a capacitor structure in accordance with the third embodiment of the present invention.

The inner wall 81c of the clamp ring 81 may be inclined in relation to the center axis of the clamp ring 81 such that the clamp becomes narrower toward the insulating film 73, as shown in FIG. 13. In other words, the inner wall 81c may be formed at an incline toward the center portion of the substrate 10.

Figure 14:
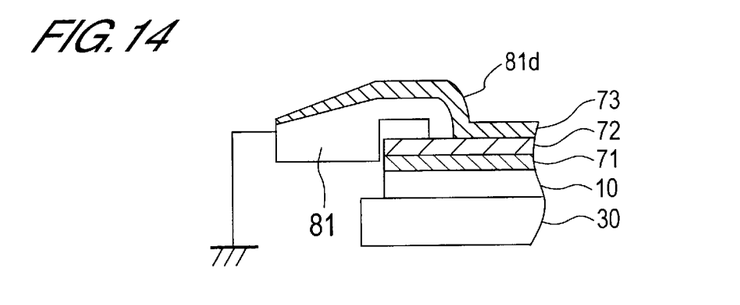
FIG. 14 is a fragmentary cross-sectional view schematically depicting a manufacturing process related to another modified example of the method for manufacturing a capacitor structure in accordance with the third embodiment of the present invention.

The inner wall 81d of the clamp ring 81 may also be inclined and curved in relation to the center axis of the clamp ring 81 such that the clamp becomes narrower toward the insulating film 73, as shown in FIG. 14.

In all other respects the third embodiment is identical to the first embodiment.

Fourth Embodiment

Figure 15:
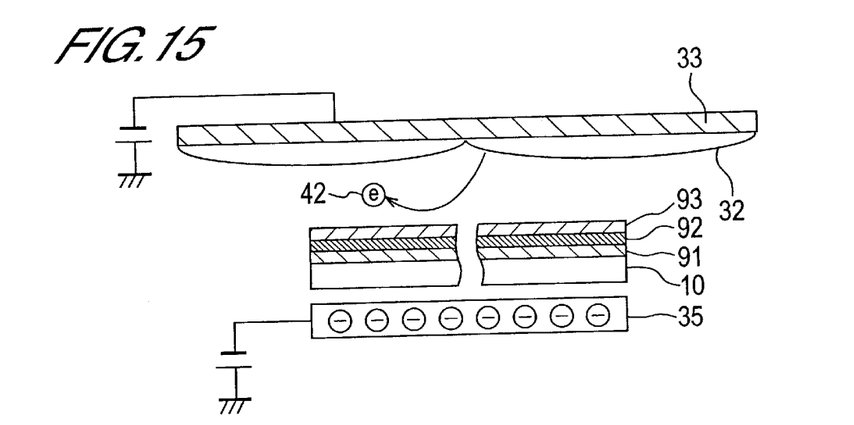
FIG. 15 is a cross-sectional view schematically depicting a manufacturing process related to the method for manufacturing a capacitor structure in accordance with a fourth embodiment of the present invention.

FIG. 15 is a cross-sectional view schematically depicting a manufacturing process related to the method for manufacturing a capacitor structure in accordance with a fourth embodiment of the present invention.

In the manufacture of a capacitor structure in accordance with the fourth embodiment, a bottom electrode film 91 and an insulating film 92 are first sequentially formed on the substrate 10, as shown in FIG. 15. The process for forming the bottom electrode film 91 may, for example, be sputtering, which is the same as in the first embodiment. The process for forming the insulating film 92 may, for example, be plasma CVD, which is the same as in the first embodiment. The process for forming the top electrode film 93 (*2) may, for example, be sputtering, which is the same as in the first embodiment. The materials for the bottom electrode film 91, insulating film 92, and top electrode film 93 are the same as those used in the first embodiment.

The sputtering apparatus (not shown) subsequently forms the top electrode film 93 in the manner described below.

Specifically, the sputtering apparatus (not shown) forms the top electrode film 93 on the insulating film 92 by performing sputtering in a state in which a susceptor electrode 35 kept at a negative potential is disposed on the back surface of the substrate 10, as shown in FIG. 15. The negative potential is determined based on the type of sputtering apparatus, type of semiconductor substrate, and other factors. The negative potential should preferably be within the range −600 V to −1200 V in order to repel the arriving electrons without breaking down the semiconductor substrate. The material of the top electrode film 93 is the same as in the first embodiment described above.

The process for manufacturing an MIM capacitor structure is thereby completed.

The process for forming an. MIM capacitor element such as the one shown in FIG. 8 from an MIM capacitor structure is the same as in the first embodiment.

As described above, the method for manufacturing a capacitor structure in accordance with the fourth embodiment is performed such that a susceptor electrode 35 kept at a negative potential is disposed on the back surface of the substrate 10. The susceptor electrode 35 forms an electrostatic field by means of the negative potential. The electrostatic field exerts a repulsive force on the electrons 42 that approach the top electrode film 93 when the top electrode film 93 is formed by sputtering, making it difficult for the electrons 42 to reach the top electrode film 93. As a result, it becomes more difficult for the insulating film 92 to be electrostatically broken down by electric charges accumulating on the top electrode film 93.

In all other respects the fourth embodiment is identical to the first embodiment. In addition, the method of the fourth embodiment can be combined with any of the first to third embodiments described above.

Fifth Embodiment

Figure 16:
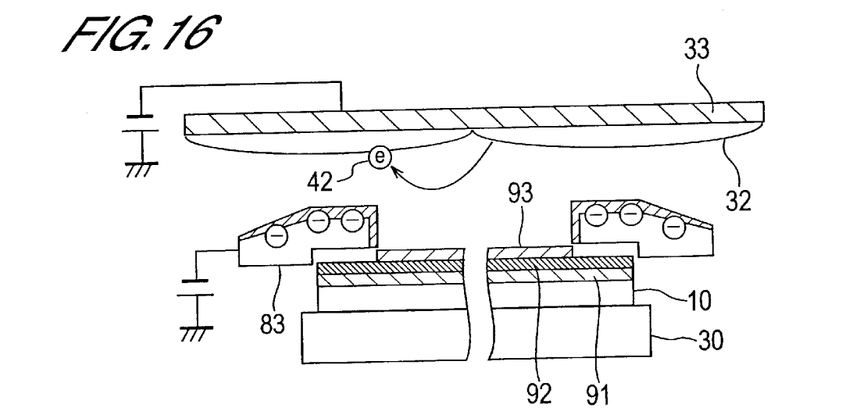
FIG. 16 is a cross-sectional view schematically depicting a manufacturing process related to the method for manufacturing a capacitor structure in accordance with a fifth embodiment of the present invention.

FIG. 16 is a cross-sectional view schematically depicting a manufacturing process related to the method for manufacturing a capacitor structure in accordance with a fifth embodiment of the present invention.

In the manufacture of a capacitor structure in accordance with the fifth embodiment, a bottom electrode film 91 and an insulating film 92 are first sequentially formed on the substrate 10, as shown in FIG. 16. The process for forming the bottom electrode film 91 may, for example, be sputtering, which is the same as in the first embodiment. The process for forming the insulating film 92 may, for example, be plasma CVD, which is the same as in the first embodiment. The materials for the bottom electrode film 91 and insulating film 92 are the same as those used in the first embodiment.

The sputtering apparatus (not shown) subsequently forms a top electrode film 93 in the manner described below.

Specifically, the sputtering apparatus (not shown) forms the top electrode film 93 on the insulating film 92 by performing sputtering in a state in which a clamp ring 83 kept at a negative potential is disposed over an area disposed in the vicinity of the external periphery of the insulating film 92, as shown in FIG. 16. The negative potential is determined based on the type of sputtering apparatus, shape of clamp ring 83, type of semiconductor substrate, and other factors. The negative potential should preferably be within the range −600 V to −1200 V in order to repel the arriving electrons without breaking down the semiconductor substrate. The material of the top electrode film 93 is the same as in the first embodiment described above.

The process for manufacturing an MIM capacitor structure is thereby completed.

The process for forming an MIM capacitor element such as the one shown in FIG. 8 from an MIM capacitor structure is the same as in the first embodiment.

As described above, the method for manufacturing a capacitor structure in accordance with the fifth embodiment is designed such that, in the process for manufacturing the top electrode film 93, a clamp ring 83 kept at a negative potential is disposed over an area disposed in the vicinity of the external periphery of the insulating film 92. The clamp ring 83 forms an electrostatic field by means of the negative potential. The electrostatic field exerts a repulsive force on the electrons 42 that approach the top electrode film 93 when the top electrode film 93 is formed by sputtering, making it difficult for the electrons 42 to reach the top electrode film 93. As a result, it becomes more difficult for the insulating film 92 to be electrostatically broken down by electric charges accumulating on the top electrode film 93.

In all other respects the fifth embodiment is identical to the first embodiment. In addition, the method of the fifth embodiment can be combined with the fourth embodiment described above.

Sixth Embodiment

Figure 17:
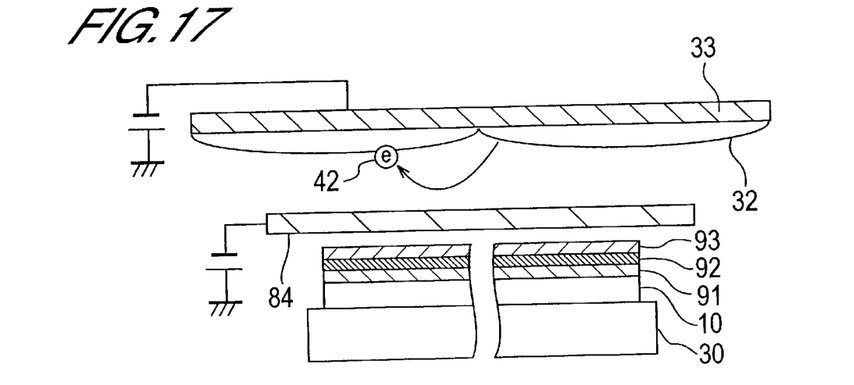
FIG. 17 is a cross-sectional view schematically depicting a manufacturing process related to the method for manufacturing a capacitor structure in accordance with a sixth embodiment of the present invention.

FIG. 17 is a cross-sectional view schematically depicting a manufacturing process related to the method for manufacturing a capacitor structure in accordance with a sixth embodiment of the present invention.

In the manufacture of a capacitor structure in accordance with the sixth embodiment, a bottom electrode film 91 and an insulating film 92 are first sequentially formed on the substrate 10, as shown in FIG. 17. The process for forming the bottom electrode film 91 may, for example, be sputtering, which is the same as in the first embodiment. The process for forming the insulating film 92 may, for example, be plasma CVD, which is the same as in the first embodiment. The materials for the bottom electrode film 91 and insulating film 92 are the same as those used in the first embodiment.

The sputtering apparatus (not shown) subsequently forms a top electrode film 93 in the manner described below.

Specifically, the sputtering apparatus (not shown) forms the top electrode film 93 on the insulating film 92 by performing sputtering in a state in which a collimator 84 kept at a negative potential is disposed above the insulating film 92, as shown in FIG. 17. The negative potential is determined based on the type of sputtering apparatus, position and shape of the collimator 84, type of semiconductor substrate, and other factors. The negative potential should preferably be within the range −600 V to −1200 V in order to repel the arriving electrons without breaking down the semiconductor substrate. The material of the top electrode film 93 is the same as in the first embodiment described above.

The process for manufacturing an MIM capacitor structure is thereby completed.

The process for forming an MIM capacitor element such as the one shown in FIG. 8 from an MIM capacitor structure is the same as in the first embodiment.

As described above, the method for manufacturing a capacitor structure in accordance with the sixth embodiment is performed such that a collimator 84 kept at a negative potential is disposed above the insulating film 92. The collimator 84 forms an electrostatic field by means of the negative potential. The electrostatic field exerts a repulsive force on the electrons 42 that approach the top electrode film 93 when the top electrode film 93 is formed by sputtering, making it difficult for the electrons 42 to reach the top electrode film 93. As a result, it becomes more difficult for the insulating film 92 to be electrostatically broken down by electric charges accumulating on the top electrode film 93.

In all other respects the sixth embodiment is identical to the fifth embodiment. In addition, the collimator 84 of the sixth embodiment can be combined with any of the first to fifth embodiments described above.

A capacitor element can be formed by the partial removal of the bottom electrode film, insulating film, and top electrode film from a capacitor structure formed by the manufacturing method disclosed with reference to any of embodiments 1 to 6. Capacitor structures formed by the manufacturing method of any of embodiments 1 to 6 have a low percent defective because no (or substantially no) electric charge accumulates on the top electrode film in these structures. For this reason, capacitor elements formed from these capacitor structures have a low percent defective as well.

What is claimed is:

1. A method for manufacturing a capacitor structure, comprising the steps of:
    forming a bottom electrode film on a substrate;
    forming an insulating film in the area of the bottom electrode film that excludes a specific area;
    bringing a grounded conductive member into contact with the specific area of the bottom electrode film;
    forming a top electrode film on the insulating film by performing sputtering such that part thereof is in contact with the specific area of the bottom electrode film; and separating the conductive member from the specific area of the bottom electrode film.

2. The method for manufacturing a capacitor structure according to claim 1, wherein the specific area of the bottom electrode film is an annular peripheral area including the external periphery of the bottom, electrode film.

3. The method for manufacturing a capacitor structure according to claim 1, wherein the conductive member is a clamp ring.

4. The method for manufacturing a capacitor structure according to claim 1, wherein the step for forming the insulating film comprises the steps of:
   depositing the insulating film on the bottom electrode film; and
   removing part of the insulating film and exposing the specific area of the bottom electrode film.

5. The method for manufacturing a capacitor structure according to claim 4, wherein the step for removing part of the insulating film comprises the steps of:
   coating the insulating film with a photoresist;
   removing the area in the vicinity of the external periphery of the photoresist by peripheral exposure or edge rinse to expose part of the insulating film; and
   removing the exposed portion of the insulating film.

6. The method for manufacturing a capacitor structure according to claim 1, wherein the step for forming the bottom electrode film comprises a step for depositing an AlCu film by sputtering.

7. The method for manufacturing a capacitor structure according to claim 1, wherein the step for forming the insulating film further comprises a step for depositing at least one film selected from an SiON film, an $SiO_2$ film, and an SiN film by plasma CVD.

8. The method for manufacturing a capacitor structure according to claim 1, wherein the step for forming the top electrode film comprises a step for depositing a TiN film by sputtering.

9. A method for manufacturing a capacitor structure, comprising the steps of:
   forming a bottom electrode film on a substrate;
   disposing a first clamp ring whose inside diameter is less than the outside diameter of the bottom electrode film above the bottom electrode film in the vicinity of the external periphery thereof;
   forming an insulating film in an area not covered by the first clamp ring on the bottom electrode film;
   separating the first clamp ring from the upper portion of the bottom electrode film;
   bringing a grounded second clamp ring whose inside diameter is less than the outside diameter of the bottom electrode film but greater than the inside diameter of the first clamp ring into contact with the bottom electrode film in the vicinity the external periphery thereof;
   forming a top electrode film on the insulating film by sputtering such that part thereof is in contact with the bottom electrode film; and
   separating the second clamp ring from the upper portion of the bottom electrode film.

10. The method for manufacturing a capacitor structure according to claim 9, wherein the step for forming the bottom electrode film comprises a step for depositing an AlCu film by sputtering.

11. The method for manufacturing a capacitor structure according to claim 9, wherein the step for forming the insulating film further comprises a step for depositing at least one film selected from an SiON film, an $SiO_2$ film, and an SiN film by plasma CVD.

12. The method for manufacturing a capacitor structure according to claim 9, wherein the step for forming the top electrode film comprises a step for depositing a TiN film by sputtering.

13. A method for manufacturing a capacitor structure, comprising the steps of:
   forming a bottom electrode film on a substrate;
   forming an insulating film on the bottom electrode film;
   bringing a grounded clamp ring whose inner wall is formed substantially perpendicularly to the surface or the substrate or whose inner wall is formed at an incline toward the center of the substrate into contact with the area in the vicinity of the external periphery of an insulating film;
   forming a top electrode film by sputtering on the insulating film and in the upper portion of the clamp ring with the inner wall; and
   separating the clamp ring from the insulating film.

14. The method for manufacturing a capacitor structure according to claim 13, wherein the step for forming the bottom electrode film comprises a step for depositing an AlCu film by sputtering.

15. The method for manufacturing a capacitor structure according to claim 13, wherein the step for forming the insulating film further comprises a step for depositing at least one film selected from an SiON film, an $SiO_2$ film, and an SiN film by plasma CVD.

16. The method for manufacturing a capacitor structure according to claim 13, wherein the step for forming the top electrode film comprises a step for depositing a TiN film by sputtering.

17. A method for manufacturing a capacitor structure, comprising the steps of:
   forming a bottom electrode film on the substrate;
   forming an insulating film on the bottom electrode film; and
   forming a top electrode film on the insulating film by performing sputtering in a state in which a member kept at a negative potential is disposed around the substrate.

18. The method for manufacturing a capacitor structure according to claim 17, wherein the member kept at a negative potential is a susceptor electrode disposed on the back surface of the substrate.

19. The method for manufacturing a capacitor structure according to claim 17, wherein the member kept at a negative potential is a clamp ring disposed above an area in the vicinity of the external periphery of the insulating film.

20. The method for manufacturing a capacitor structure according to claim 17, wherein the member kept at a negative potential is a collimator disposed above the insulating film.

21. The method for manufacturing a capacitor structure according to claim 17, wherein the negative potential is set between −600 V and −1200 V.

22. The method for manufacturing a capacitor structure according to claim 17, wherein the step for forming the bottom electrode film comprises a step for depositing an AlCu film by sputtering.

23. The method for manufacturing a capacitor structure according to claim 17, wherein the step for forming the insulating film further comprises a step for depositing at least one film selected from an SION film, an $SiO_2$ film, and an SiN film by plasma CVD.

24. The method for manufacturing a capacitor structure according to claim 17, wherein the step for forming the top electrode film comprises a step for depositing a TiN film by sputtering.

25. A method for manufacturing a capacitor element, comprising the steps of:

forming a capacitor structure on a substrate by the manufacturing method according to claim 1; and partially removing the bottom electrode film, insulating film, and top electrode film constituting the capacitor structure to form a single capacitor element or a plurality of capacitor elements from the remaining bottom electrode film, insulating film, and top electrode film.

26. A method for manufacturing a capacitor element, comprising the steps of:

forming a capacitor structure on a substrate by the manufacturing method according to claim 9; and partially removing the bottom electrode film, insulating film, and top electrode film constituting the capacitor structure to form a single capacitor element or a plurality of capacitor elements from the remaining bottom electrode film, insulating film, and top electrode film.

27. A method for manufacturing a capacitor element, comprising the steps of:

forming a capacitor structure on a substrate by the manufacturing method according to claim 13; and partially removing the bottom electrode film, insulating film, and top electrode film constituting the capacitor structure to form a single capacitor element or a plurality of capacitor elements from the remaining bottom electrode film, insulating film, and top electrode film.

28. A method for manufacturing a capacitor element, comprising the steps of:

forming a capacitor structure on a substrate by the manufacturing method according to claim 17; and partially removing the bottom electrode film, insulating film, and top electrode film constituting the capacitor structure to form a single capacitor element or a plurality of capacitor elements from the remaining bottom electrode film, insulating film, and top electrode film.

* * * * *